US008812150B2

(12) United States Patent
van der Meulen et al.

(10) Patent No.: US 8,812,150 B2
(45) Date of Patent: Aug. 19, 2014

(54) SEMICONDUCTOR MANUFACTURING PROCESS MODULES

(75) Inventors: Peter van der Meulen, Newburyport, MA (US); Christopher C Kiley, Carlisle, MA (US); Patrick D. Pannese, Lynnfield, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 920 days.

(21) Appl. No.: 11/876,869

(22) Filed: Oct. 23, 2007

(65) Prior Publication Data

US 2008/0219808 A1 Sep. 11, 2008

Related U.S. Application Data

(63) Continuation of application No. 11/681,978, filed on Mar. 5, 2007, now abandoned, which is a continuation-in-part of application No. 10/985,834, filed on Nov. 10, 2004, which is a continuation-in-part of application No. 11/679,829, filed on Feb. 27, 2007.

(60) Provisional application No. 60/779,684, filed on Mar. 5, 2006, provisional application No. 60/779,707, filed on Mar. 5, 2006, provisional application No. 60/779,478, filed on Mar. 5, 2006, provisional application No. 60/779,463, filed on Mar. 5, 2006, provisional application No. 60/779,609, filed on Mar. 5, 2006, provisional application No. 60/784,832, filed on Mar. 21, 2006, provisional application No. 60/746,163, filed on May 1, 2006, provisional application No. 60/807,189, filed on Jul. 12, 2006, provisional application No. 60/823,454, filed on Aug. 24, 2006, provisional application No. 60/777,443, filed on Feb. 27, 2006, provisional application No. 60/518,823, filed on Nov. 10, 2003, provisional application No. 60/607,649, filed on Sep. 7, 2004.

(51) Int. Cl.
*G06F 7/00* (2006.01)

(52) U.S. Cl.
USPC ................................................ 700/228

(58) Field of Classification Search
USPC ............ 700/214, 213, 217, 228, 121, 28, 29, 700/31, 32; 414/935, 936, 217
See application file for complete search history.

(56) References Cited

U.S. PATENT DOCUMENTS

| 4,664,578 A | 5/1987 | Kakehi |
| 4,722,298 A | 2/1988 | Rubin et al. |
| 5,076,205 A | 12/1991 | Vowles et al. |
| 5,310,410 A | 5/1994 | Begin et al. |
| 5,405,230 A | 4/1995 | Ono et al. |

(Continued)

FOREIGN PATENT DOCUMENTS

| EP | 506045 | 9/1992 |
| EP | 597637 | 5/1994 |
| EP | 10597637 | 5/1994 |

*Primary Examiner* — Ramya Burgess
(74) *Attorney, Agent, or Firm* — Perman & Green, LLP; Colin C. Durham

(57) ABSTRACT

A method is provided. The method includes disposing a plurality of robotic facilities to form a semiconductor handling system, controlling the semiconductor handling system with a controller to handoff a workpiece between neighboring robotic facilities, and providing a software interface for the controller, wherein the software interface permits a user to view alternate configurations of the handling system in order to optimize a characteristic of the handling system.

20 Claims, 19 Drawing Sheets

(56) References Cited

U.S. PATENT DOCUMENTS

| | | | | |
|---|---|---|---|---|
| 5,417,537 | A | 5/1995 | Miller | |
| 5,435,683 | A | 7/1995 | Oosawa et al. | |
| 5,483,138 | A | 1/1996 | Shmookler et al. | |
| 5,563,798 | A | 10/1996 | Berken et al. | |
| 5,609,689 | A | 3/1997 | Kato et al. | 118/719 |
| 5,636,960 | A | 6/1997 | Hiraki et al. | |
| 5,695,564 | A | 12/1997 | Imahashi | 118/719 |
| 5,706,201 | A | 1/1998 | Andrews | |
| 5,900,105 | A | 5/1999 | Toshima | |
| 5,917,601 | A | 6/1999 | Shimazaki et al. | |
| 5,944,857 | A | 8/1999 | Edwards et al. | 29/25.01 |
| 5,980,194 | A | 11/1999 | Freerks et al. | |
| 6,045,315 | A | 4/2000 | Azumano et al. | |
| 6,053,687 | A | 4/2000 | Kirkpatrick et al. | |
| 6,053,980 | A | 4/2000 | Suda et al. | |
| 6,079,927 | A * | 6/2000 | Muka | 414/217 |
| 6,082,950 | A | 7/2000 | Altwood et al. | |
| 6,105,454 | A | 8/2000 | Bacchi et al. | |
| 6,149,367 | A | 11/2000 | Begin | 414/331.18 |
| 6,198,074 | B1 | 3/2001 | Savas | 219/390 |
| 6,224,312 | B1 | 5/2001 | Sundar | |
| 6,235,634 | B1 * | 5/2001 | White et al. | 438/680 |
| 6,312,525 | B1 | 11/2001 | Bright et al. | |
| 6,315,512 | B1 | 11/2001 | Tabrizi et al. | |
| 6,339,730 | B1 | 1/2002 | Matsushima | |
| 6,405,101 | B1 | 6/2002 | Johanson et al. | |
| 6,440,261 | B1 | 8/2002 | Tepman et al. | |
| 6,502,054 | B1 | 12/2002 | Mooring et al. | |
| 6,503,365 | B1 | 1/2003 | Kim et al. | |
| 6,516,244 | B1 | 2/2003 | Yoo et al. | |
| 6,519,504 | B1 | 2/2003 | Soraoka et al. | 700/228 |
| 6,549,825 | B2 | 4/2003 | Kurata | |
| 6,697,517 | B1 | 2/2004 | Hunter | |
| 6,707,545 | B1 | 3/2004 | Hunter | |
| 6,721,045 | B1 | 4/2004 | Hunter | |
| 6,742,977 | B1 | 6/2004 | Okayama et al. | |
| 6,742,980 | B2 | 6/2004 | Sasaki | |
| 6,788,935 | B1 | 9/2004 | McKenna et al. | |
| 6,813,032 | B1 | 11/2004 | Hunter | |
| 6,827,788 | B2 | 12/2004 | Takahashi | |
| 6,845,292 | B2 | 1/2005 | Sha et al. | |
| 6,856,858 | B2 | 2/2005 | Kurita | |
| 6,979,165 | B2 | 12/2005 | Larson et al. | |
| 7,012,684 | B1 | 3/2006 | Hunter | |
| 7,198,448 | B2 * | 4/2007 | Ozawa et al. | 414/217 |
| 7,331,751 | B2 | 2/2008 | Tamura | 414/805 |
| 7,387,484 | B2 | 6/2008 | Ho et al. | |
| 7,422,406 | B2 | 9/2008 | van der Meulen | |
| 7,599,691 | B1 | 10/2009 | Mitchell | |
| 7,622,006 | B2 | 11/2009 | Ishizawa et al. | 118/719 |
| 7,905,960 | B2 | 3/2011 | Choi et al. | |
| 7,959,395 | B2 | 6/2011 | Hofmeister et al. | |
| 2001/0002358 | A1 * | 5/2001 | Hempel et al. | 451/66 |
| 2001/0048867 | A1 | 12/2001 | Lebar et al. | |
| 2002/0131848 | A1 | 9/2002 | Kurata | |
| 2002/0192056 | A1 | 12/2002 | Reimer et al. | |
| 2003/0035705 | A1 | 2/2003 | Johnson | |
| 2003/0088530 | A1 * | 5/2003 | Ramanan | 706/13 |
| 2003/0131458 | A1 | 7/2003 | Wang et al. | |
| 2003/0168173 | A1 | 9/2003 | Tamura | |
| 2004/0013497 | A1 | 1/2004 | Shirai | |
| 2004/0069225 | A1 * | 4/2004 | Fairbairn et al. | 118/715 |
| 2004/0105737 | A1 | 6/2004 | Ozawa et al. | |
| 2004/0221871 | A1 | 11/2004 | Fletcher et al. | |
| 2005/0113976 | A1 * | 5/2005 | van der Meulen | 700/245 |
| 2005/0118000 | A1 | 6/2005 | Kasai et al. | |
| 2006/0241813 | A1 * | 10/2006 | Babu et al. | 700/255 |
| 2006/0246683 | A1 | 11/2006 | Pan et al. | |
| 2007/0071581 | A1 | 3/2007 | Gilchrist et al. | |
| 2007/0073430 | A1 * | 3/2007 | Govind et al. | 700/99 |
| 2007/0093430 | A1 * | 4/2007 | Chen et al. | 514/19 |
| 2007/0147979 | A1 * | 6/2007 | Rice et al. | 414/744.1 |
| 2008/0147333 | A1 | 6/2008 | van der Meulen et al. | |
| 2012/0213614 | A1 | 8/2012 | Bonora et al. | |

* cited by examiner

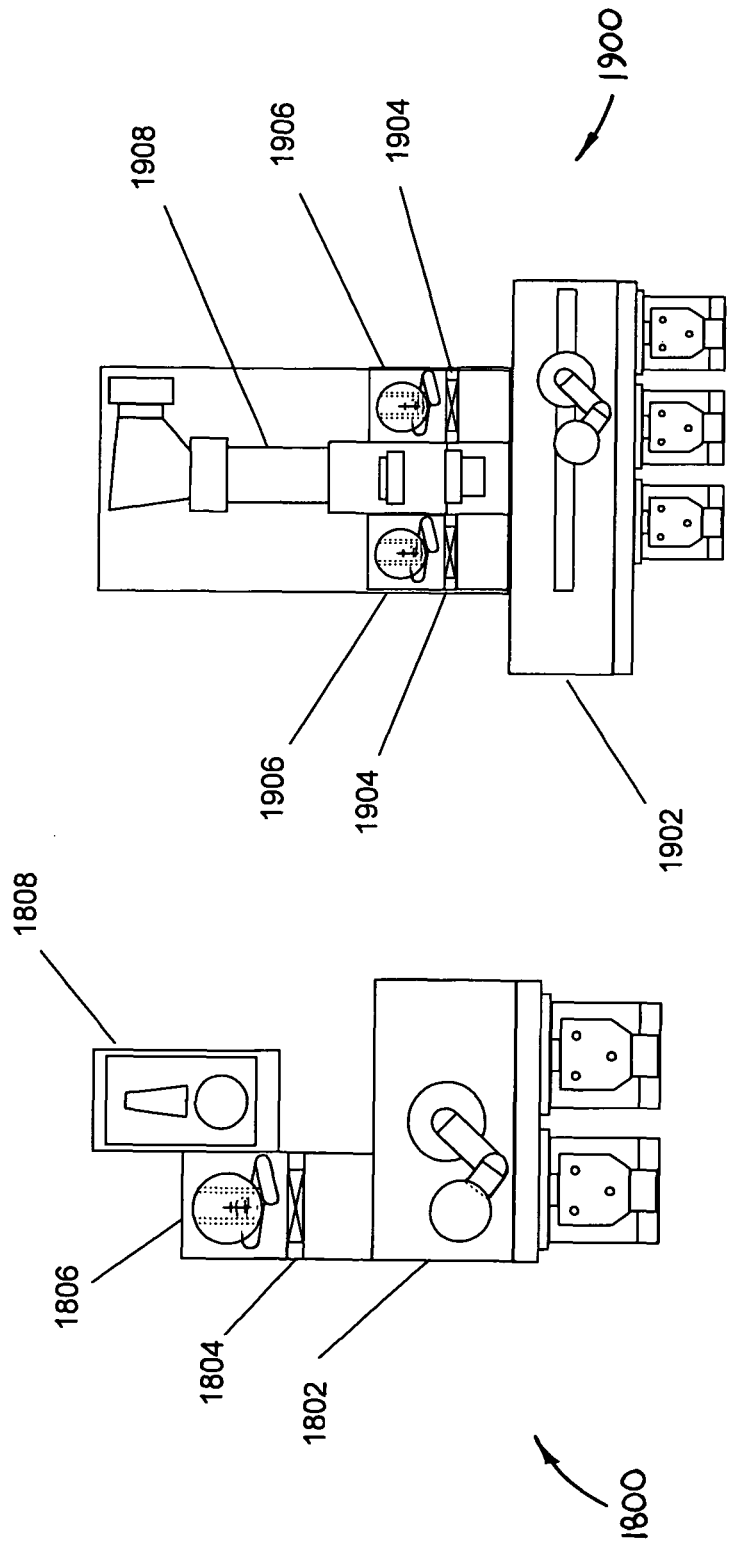

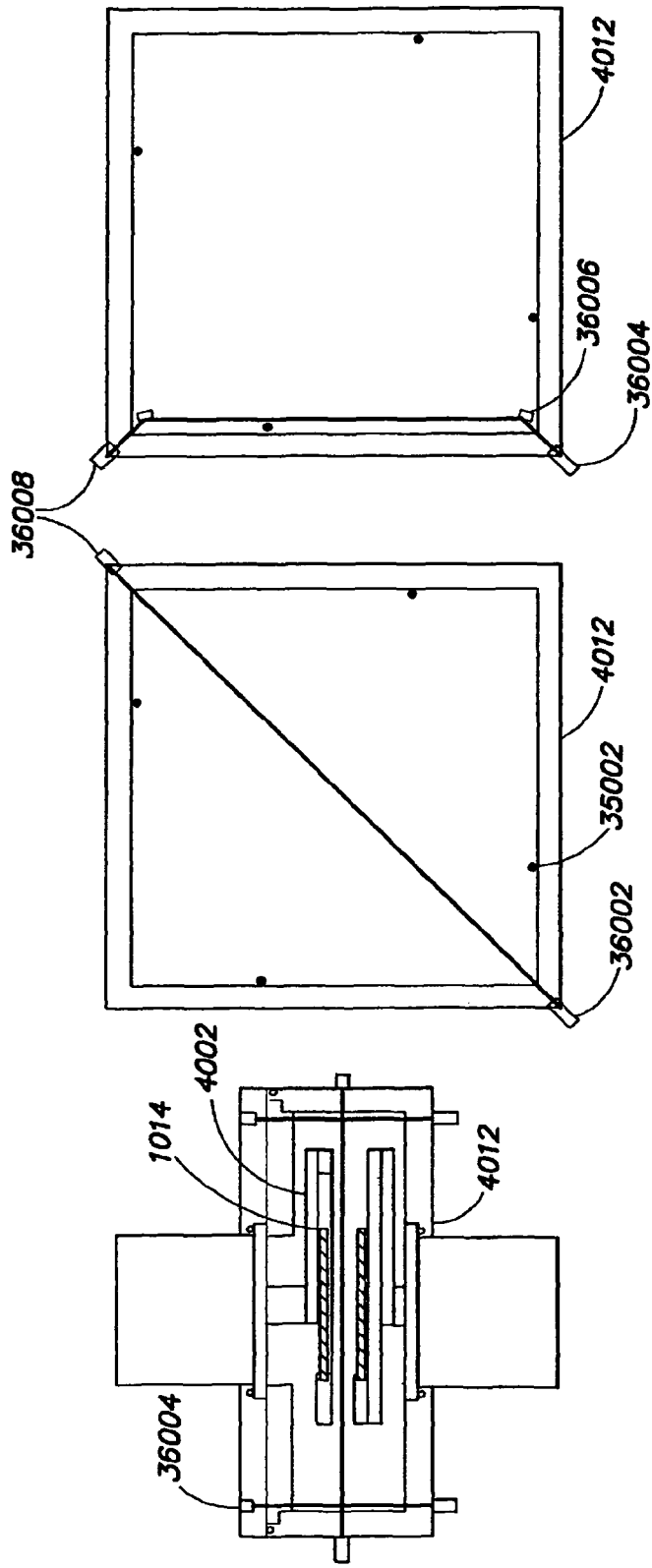

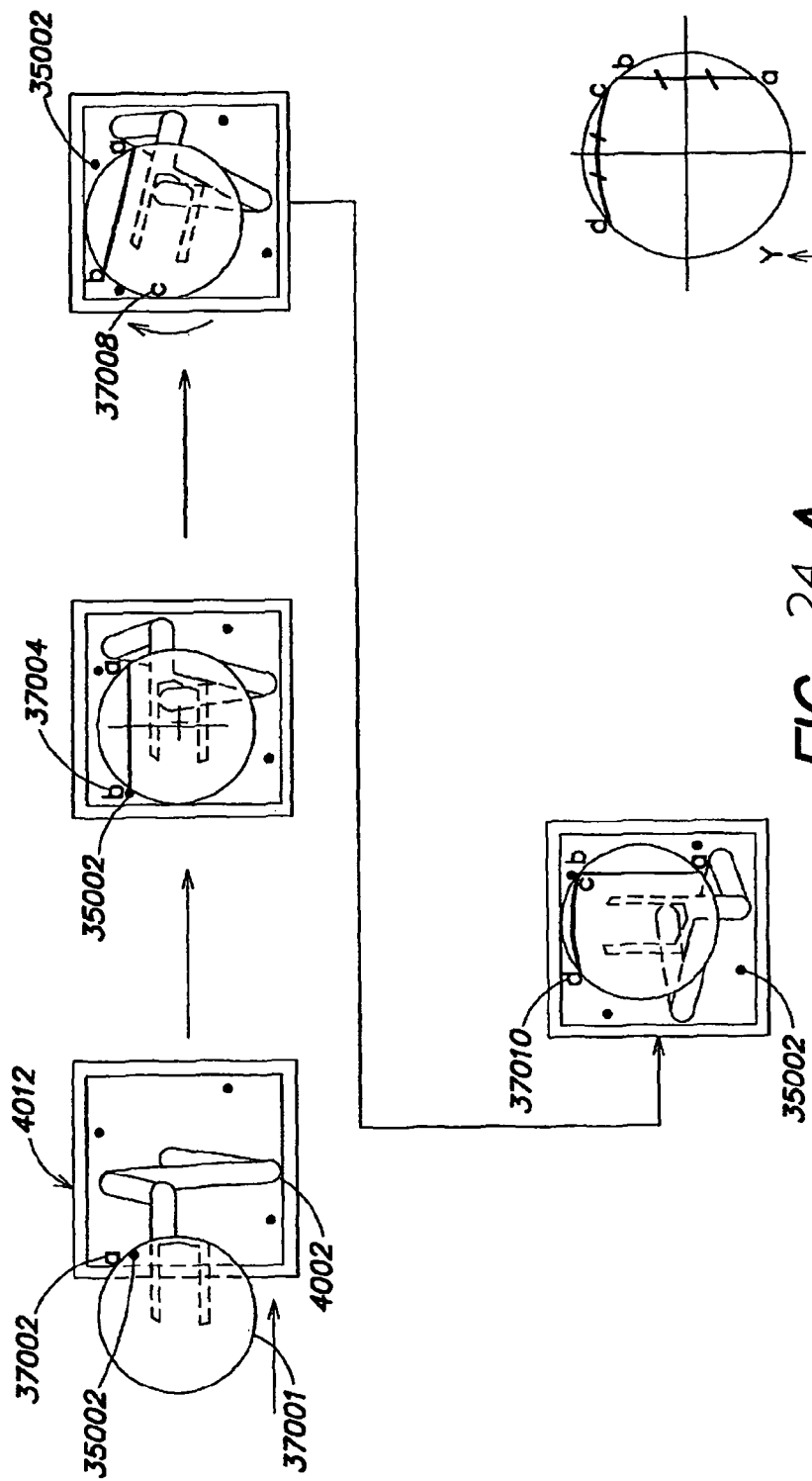

SEMICONDUCTOR MANUFACTURING PROCESS MODULES

CROSS-REFERENCE TO RELATED APPLICATIONS

This application is a continuation-in-part of U.S. application Ser. No. 11/679,829 filed on Feb. 27, 2007, which claims the benefit of U.S. Prov. App. No. 60/777,443 filed on Feb. 27, 2006, and is a continuation-in-part of U.S. application Ser. No. 10/985,834 filed on Nov. 10, 2004 which claims the benefit of U.S. Prov. App. No. 60/518,823 filed on Nov. 10, 2003 and U.S. Prov. App. No. 60/607,649 filed on Sep. 7, 2004.

This application also claims the benefit of the following U.S. applications: U.S. Prov. App. No. 60/779,684 filed on Mar. 5, 2006; U.S. Prov. App. No. 60/779,707 filed on Mar. 5, 2006; U.S. Prov. App. No. 60/779,478 filed on Mar. 5, 2006; U.S. Prov. App. No. 60/779,463 filed on Mar. 5, 2006; U.S. Prov. App. No. 60/779,609 filed on Mar. 5, 2006; U.S. Prov. App. No. 60/784,832 filed on Mar. 21, 2006; U.S. Prov. App. No. 60/746,163 filed on May 1, 2006; U.S. Prov. App. No. 60/807,189 filed on Jul. 12, 2006; and U.S. Prov. App. No. 60/823,454 filed on Aug. 24, 2006.

All of the foregoing applications are commonly owned, and all of the foregoing applications are incorporated herein by reference.

BACKGROUND

1. Field

The invention herein disclosed generally relates to semiconductor processing systems in a vacuum environment, and specifically relates to configurations of handling and process chambers for semiconductor processing in a vacuum environment.

2. Description of the Related Art

In a conventional semiconductor manufacturing system, a number of different process modules are interconnected within a vacuum or other environment and controlled to collectively process semiconductor wafers for various uses. The complexity of these manufacturing systems continues to grow both due to the increased complexity of processing larger wafers with smaller features, and due to the increasing possibilities for using a single system for several different end-to-end processes, as described for example in commonly-owned U.S. application Ser. No. 11/679,829 filed on Feb. 27, 2007. As the complexity of a fabrication system grows, it becomes increasingly difficult to schedule resources within the system in a manner that maintains good utilization of all the various process modules. While a part of this difficulty flows from the complexity of the processing recipe itself, another part of the difficulty comes from the differences in processing time for various processing steps. The generally high acquisition and operating costs of production semiconductor vacuum processing systems dictate high utilization of the handling, processing, and other modules within the systems.

Within a family of similar semiconductor products, or within a range of families within a technology, at least some of the processing steps may be commonly applied to all wafers. However, because of the unique processing requirements to achieve the final semiconductor device, sharing common processing steps may be very difficult with fixed processing systems. While it may be possible to share these common process steps by configuring them as separate machines, every machine-to-machine transfer imposes time delays and risks of contamination As a result, duplication of equipment, and the resulting underutilization of the equipment, is a common challenge with semiconductor vacuum processing operation in a semiconductor fabrication facility.

There remains a need for process modules adapted to current semiconductor manufacturing needs, and in particular, for process modules that can help to balance load, increase throughput, and improve utilization within complex processing systems.

SUMMARY

A variety of process modules are described for use in semiconductor manufacturing processes.

In one aspect, a device disclosed herein includes a single entry shaped and sized for passage of a single wafer; an interior chamber adapted to hold a plurality of wafers in a side-by-side configuration; a slot valve operable to selectively isolate the interior chamber; and a tool for processing the plurality of wafers within the interior chamber.

The plurality of wafers may consist of two wafers. The two wafers may be equidistant from the single entry. The two wafers may be in line with the single entry. The plurality of wafers may consist of three entries. The plurality of wafers may be arranged in a triangle. The device may include a wafer handler within the interior chamber, the wafer handler rotatable to position one of the plurality of wafers nearest to the single entry. The tool may process one of the plurality of wafers at a time. The device may include a single robotic arm adapted to place or retrieve any one of the plurality of wafers within the interior chamber.

In another aspect, a device disclosed herein includes an interior chamber adapted to hold a plurality of wafers; a first entry to the interior chamber shaped and size for passage of a single wafer and selectively isolated with a first slot valve; a second entry to the interior chamber shaped and size for passage of a single wafer and selectively isolated with a second slot valve; and a tool for processing the plurality of wafers within the interior chamber.

The first entry and the second entry may be positioned for access by two robotic arms positioned for a robot-to-robot hand off. The first entry and the second entry may be positioned for access by two robotic arms having center axes spaced apart by less than twice a wafer diameter. The first entry and the second entry may be positioned for access by two adjacent robotic arms positioned for hand off using a buffer location. The device may include two robotic arms, each one of the robotic arms positioned to access one of the first and second entries, and the robotic arms operable to concurrently place at least two wafers into the interior chamber substantially simultaneously. The device may include two robotic arms and a buffer sharing a common isolation environment, each one of the robotic arms positioned to access one of the first and second entries and adapted to transfer one of the plurality of wafers to the other one of the robotic arms using the buffer. The device may include a third entry to the interior chamber shaped and size for passage of a single wafer and selectively isolated with a third slot valve.

In another aspect, a device disclosed herein includes an entry shaped and size for passage of at least one wafer, the entry having a width substantially larger than the diameter of the at least one wafer; an interior chamber adapted to hold a plurality of wafers; a slot valve operable to selectively isolate the interior of the chamber; and a tool for processing the plurality of wafers within the interior chamber.

The entry may be adapted to accommodate linear access by a robot to a plurality of wafers within the interior chamber. The entry may have a width at least twice the diameter of one of the plurality of wafers.

In another aspect, a device disclosed herein includes a first entry shaped and sized for passage of a wafer; a first interior accessible through the first entry; a first slot valve operable to selectively isolate the first interior; a second entry shaped and sized for passage of the wafer; a second interior accessible through the second entry; and a second slot valve operable to selectively isolate the second interior.

The device may include a robotic arm adapted to access the first interior and the second interior. The robotic arm may include a four-link SCARA arm. The device may include two robotic arms, including a first robotic arm adapted to access the first interior and a second robotic arm adapted to access the second interior. The first robotic arm and the second robotic arm may be separated by a buffer station. The first interior may include a vacuum sub-chamber adapted for independent processing of wafers. The second interior may include a second vacuum sub-chamber having a different processing tool than the first interior. The second interior may be separated from the first interior by a wall. The first entry and the second entry may be substantially coplanar. The first entry may form a first plane angled to a second plane formed by the first entry. The device may include a robotic arm adapted to access the first entry and the second entry, wherein the first plane and the second plane are substantially normal to a line through a center axis of the robotic arm. The device may include a third entry shaped and sized for passage of a wafer, a third interior accessible through the third entry, and a third slot valve operable to selectively isolate the third interior.

In another aspect, a device disclosed herein includes a first entry shaped and sized for passage of a wafer; an interior chamber adapted to hold a wafer; a second entry shaped and sized for passage of the wafer, the second entry on an opposing side of the interior chamber from the first entry; a slot valve at each of the first and second entries, the slot valves operable to selectively isolate the interior chamber; and a tool for processing the wafer within the interior chamber.

The devices disclosed herein may be combined in various ways within a semiconductor fabrication system, for example to form fabrication facilities adapted to balance processing load among relatively fast and relatively slow processes, or between processes amenable to batch processing and processes that are dedicated to a single wafer.

In one aspect, a system disclosed herein includes a plurality of process modules coupled together to form a vacuum environment, the plurality of process modules including at least one process module selected from the group consisting of an in-line process module, a dual-entry process module, and a wide-entry process module; one or more robot handlers within the vacuum environment adapted to transfer wafers among the plurality of process modules; and at least one load lock adapted to transfer wafers between the vacuum environment and an external environment.

The system may include at least one multi-wafer process module having an entry shaped and sized for passage of a single wafer.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The invention and the following detailed description of certain embodiments thereof may be understood by reference to the following figures:

FIG. 18 shows a process module containing a scanning electron microscope.

FIG. 19 shows a process module containing an ion implantation system.

FIGS. 23A, 23B and 23C illustrate a fabrication facility in a cross-sectional side view showing optical beam paths and alternatives beam paths.

FIGS. 24A and 24B illustrate how optical sensors can be used to determine the center of the material handled by a robotic arm.

DETAILED DESCRIPTION

Figure 1:
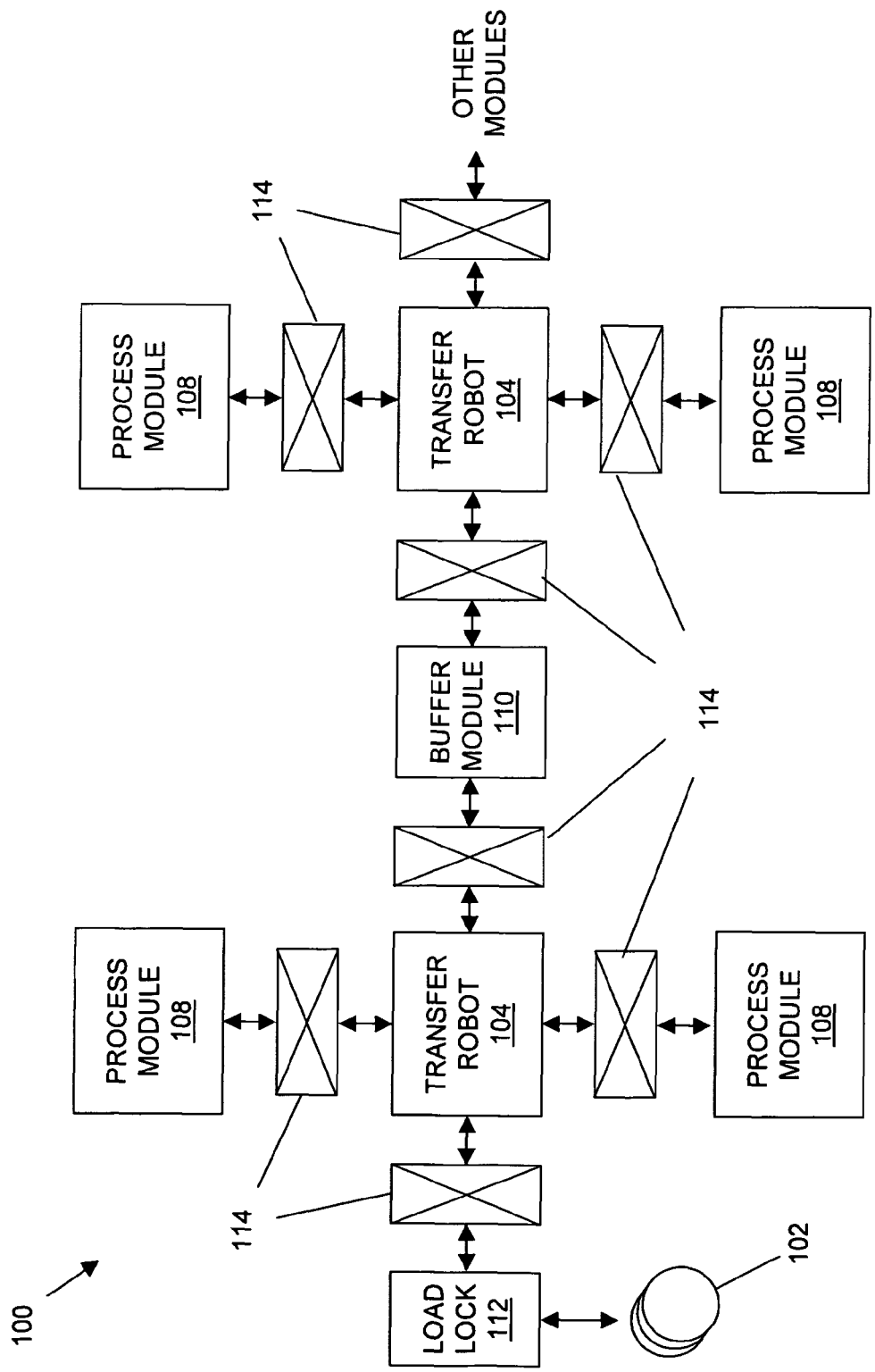
FIG. 1 depicts a generalized layout of a vacuum semiconductor manufacturing system.

FIG. 1 shows a generalized layout of a semiconductor manufacturing system. The system 100 may include one or more wafers 102, a load lock 112, one or more transfer robots 104, one or more process modules 108, one or more buffer modules 110, and a plurality of slot valves 114 or other isolation valves for selectively isolated chambers of the system 100, such as during various processing steps. In general operation, the system 100 operates to process wafers for use in, for example, semiconductor devices.

Wafers 102 may be moved from atmosphere to the vacuum environment through the load lock 112 for processing by the process modules 108. It will be understood that, while the following description is generally directed to wafers, a variety of other objects may be handled within the system 100 including a production wafer, a test wafer, a cleaning wafer, a calibration wafer, or the like, as well as other substrates (such as for reticles, magnetic heads, flat panels, and the like), including square or rectangular substrates, that might usefully be processed in a vacuum or other controlled environment. All such workpieces are intended to fall within the scope of the term "wafer" as used herein unless a different meaning is explicitly provided or otherwise clear from the context.

The transfer robots 104, which may include robotic arms and the like, move wafers within the vacuum environment such as between process modules, or to and from the load lock 112.

The process modules 108 may include any process modules suitable for use in a semiconductor manufacturing process. In general, a process module 108 includes at least one tool for processing a wafer 102, such as tools for epitaxy, chemical vapor deposition, physical vapor deposition, etching, plasma processing, lithography, plating, cleaning, spin coating, and so forth. In general, the particular tool or tools provided by a module 108 are not important to the systems and methods disclosed herein, except to the extent that particular processes or tools have physical configuration requirements that constrain the module design 108 or wafer handling. Thus, in the following description, references to a tool or process module will be understood to refer to any tool or process module suitable for use in a semiconductor manufacturing process unless a different meaning is explicitly provided or otherwise clear from the context.

Various process modules 108 will be described below. By way of example and not limitation, the process modules 108 may have various widths, such as a standard width, a double-wide width, a stretched width, or the like. The width may be selected to accommodate other system components, such as two side-by-side transfer robot modules, two transfer robot modules separated by a buffer module, two transfer robot modules separated by a transfer station, or the like. It will be understood that the width may instead be selected to accommodate more robots, such as three robots, four robots, or more, either with or without buffers and/or transfer stations. In addition, a process module 108 may accommodate a plurality of vacuum sub-chamber modules within the process module 108, where access to the vacuum sub-chamber modules may be from a plurality of transfer robot modules through a plurality of isolation valves. Vacuum sub-chamber modules may also accommodate single wafers or groups of wafers. Each sub-chamber module may be individually controlled, to accommodate different processes running in different vacuum sub-chamber modules.

A number of buffer modules 110 may be employed in the system 100 to temporarily store wafers 102, or facilitate transfer of wafers 102 between robots 104. Buffer modules 110 may be placed adjacent to a transfer robot module 104, between two transfer robot modules 104, between a transfer robot module 104 and an equipment front-end module ("EFEM"), between a plurality of robots 104 associated with modules, or the like. The buffer module 110 may hold a plurality of wafers 102, and the wafers 102 in the buffer module 110 may be accessed individually or in batches. The buffer module 110 may also offer storage for a plurality of wafers 102 by incorporating a work piece elevator, or multi-level shelving (with suitable corresponding robotics). Wafers 102 may undergo a process step while in the buffer module 110, such as heating, cooling, cleaning, testing, metrology, marking, handling, alignment, or the like.

The load lock 112 permits movement of wafers 102 into and out of the vacuum environment. In general, a vacuum system evacuates the load lock 112 before opening to a vacuum environment in the interior of the system, and vents the load lock 112 before opening to an exterior environment such as the atmosphere. The system 100 may include a number of load locks at different locations, such as at the front of the system, back of the system, middle of the system, and the like. There may be a number of load locks 112 associated with one location within the system, such as multiple load locks 112 located at the front of the linear processing system. In addition, front-end load locks 112 may have a dedicated robot and isolation valve associated with them for machine assisted loading and unloading of the system. These systems, which may include EFEMs, front opening unified pods ("FOUPs"), and the like, are used to control wafer movement of wafers into and out of the vacuum processing environment.

The isolation valves 114 are generally employed to isolate process modules during processing, or to otherwise isolate a portion of the vacuum environment from other interior regions. Isolation valves 114 may be placed between other components to temporarily isolate the environments of the system 100, such as the interior chambers of process modules 108 during wafer processing. An isolation valve 114 may open and close, and provide a vacuum seal when closed. Isolation valves 114 may have a variety of sizes, and may control entrances that are serviced by one or more robots. A number of isolation valves 114 are described in greater detail below.

Other components may be included in the system 100. For example, the system 100 may include a scanning electron microscope module, an ion implantation module, a flow through module, a multifunction module, a thermal bypass module, a vacuum extension module, a storage module, a transfer module, a metrology module, a heating or cooling station, or any other process module or the like. In addition these modules may be vertically stacked, such as two load locks stacked one on top of the other, two process modules stacked one on top of the other, or the like.

It will be understood that, while FIG. 1 shows a particular arrangement of modules and so forth, that numerous combinations of process modules, robots, load locks, buffers, and the like may suitably be employed in a semiconductor manufacturing process. The components of the system 100 may be changed, varied, and configured in numerous ways to accommodate different semiconductor processing schemes and customized to adapt to a unique function or group of functions. All such arrangements are intended to fall within this description. In particular, a number of process modules are described below that may be used with a semiconductor processing system such as the system 100 described with reference to FIG. 1.

Figure 2:
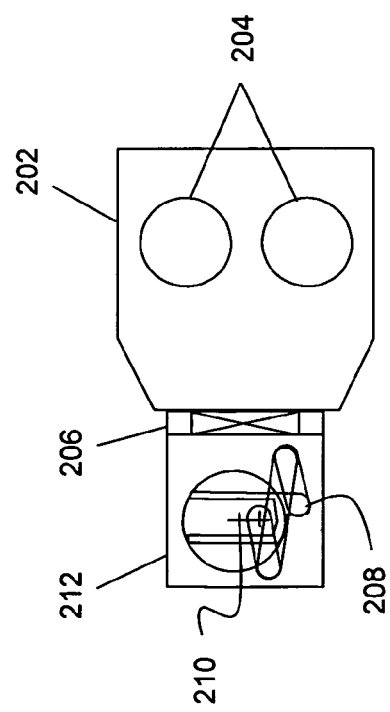
FIG. 2 shows a multi-wafer process module.

FIG. 2 shows a multi-wafer process module. The module 202 may include a processing tool (not shown) for processing wafers 204 disposed in an interior thereof. Access to the interior may be through an entry 206 that includes an isolation valve or the like operable to selectively isolate the interior of the module 202. A robot 208 may be positioned outside the entry 206, and adapted to place wafers 204 in the interior, or to retrieve the wafers 204 from the interior. In the embodiment of FIG. 2, the module 202 is adapted to receive two wafers 204 side by side and substantially equidistant from the entry 206 and the robot 208. In this arrangement, a clear access path is provided for the robot 208 to each wafer 204, and the symmetry may advantageously simplify design of the module 202.

In general the size of the entry 206 would be only wide enough and tall enough to accommodate a single wafer 204, along with an end effector and any other portions of the robot that must pass into the interior during handling. This size may be optimized by having the robot 208 move wafers straight through a center of the entry 206, which advantageously conserves valuable volume within the vacuum environment. However, it will be understood that the size of the wafer 204 may vary. For example, while 300 mm is a conventional size for current wafers, new standards for semiconductor manufacturing provide for wafers over 400 mm in size. Thus it will be understood that the shape and size of components (and voids) designed for wafer handling may vary, and one skilled in the art would understand how to adapt components such as the entry 206 to particular wafer dimensions. In other embodiments, the entry 206 may be positioned and sized to provide a straight-line path from the wafer's position within the module 202 and the wafer's position when at a center 210 of a chamber 212 housing the robot 208. In other embodiments, the entry 206 may be positioned and sized to provide a straight-line path from the wafer's position within the module 202 and a center axis of the robot 208 (which will vary according to the type of robotic arm employed).

Figure 3:
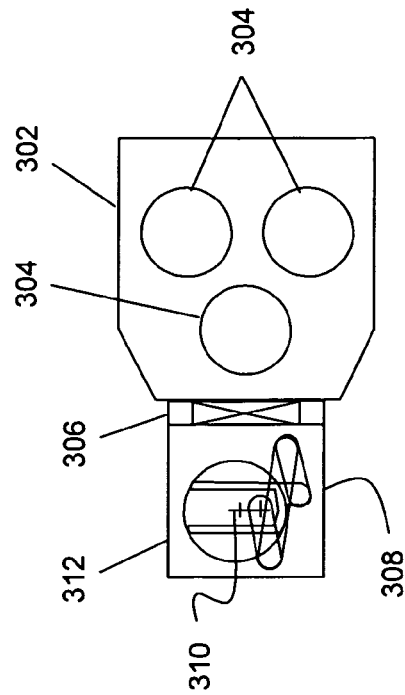
FIG. 3 shows a multi-wafer process module.

FIG. 3 shows a multi-wafer process module. The module 302 typically includes one or more tools to process wafers 304 therein. As depicted, the three wafers 304 may be oriented in a triangle. The entry 306 may be shaped and sized for passage of a single wafer, or may be somewhat wider to accommodate different paths for wafer passage in and out of an interior of the module 302. It will be understood that other arrangements of three wafers 304 may be employed, including wafers spaced radially equidistant from a center 310 of a robot handling module 312, or linearly in various configurations. It will also be understood that, unless the robot 308 has z-axis or vertical movement capability, the wafer 304 closest to the entrance 306 must generally be placed in last and removed first.

Figure 4:
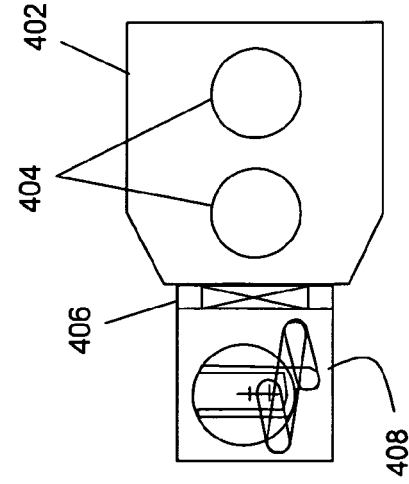
FIG. 4 shows a multi-wafer process module.

FIG. 4 shows a multi-wafer process module. This module 402 positions two wafers 404 in-line with the entry 406, which may advantageously permit the robot 408 to employ a single linear motion for accessing both wafers 404.

Figure 5:
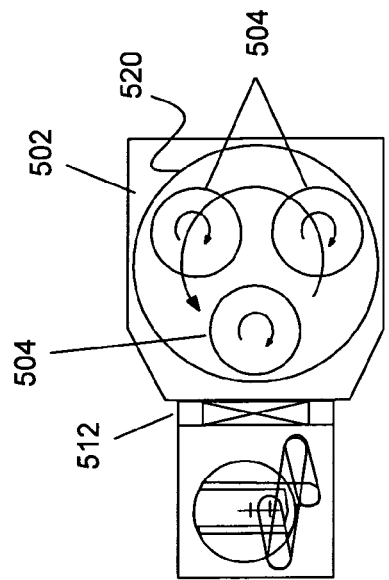
FIG. 5 shows a multi-wafer process module.

FIG. 5 shows a multi-wafer process module. This module 502 includes a wafer handler 520 adapted to move wafers 504 within the module 502. In one embodiment, the wafer handler 520 may operate in a lazy-Suzan configuration to rotate one of the wafers 504 nearest to the entry 512. In this configuration, the wafer handler 520 may also rotate wafers 504 on the rotating handler 520 (using, for example, individual motors or a planetary gear train) to maintain rotational alignment of each wafer relative to the module 502. It will be understood that, while a rotating handler is one possible configuration for the handler 520 that advantageously provides a relatively simple mechanical configuration, other arrangements are also possible including a conveyer belt, a Ferris wheel, a vertical conveyer belt with shelves for wafers, an elevator, and so forth. In general, any mechanical system suitable for accommodating loading of multiple wafers into the module 502, and preferable systems that accommodate use of an entry 512 sized for a single wafer and/or systems that reduce the required reach of robots into the module, may be useful employed in a multi-wafer process module as described herein.

Figure 6:
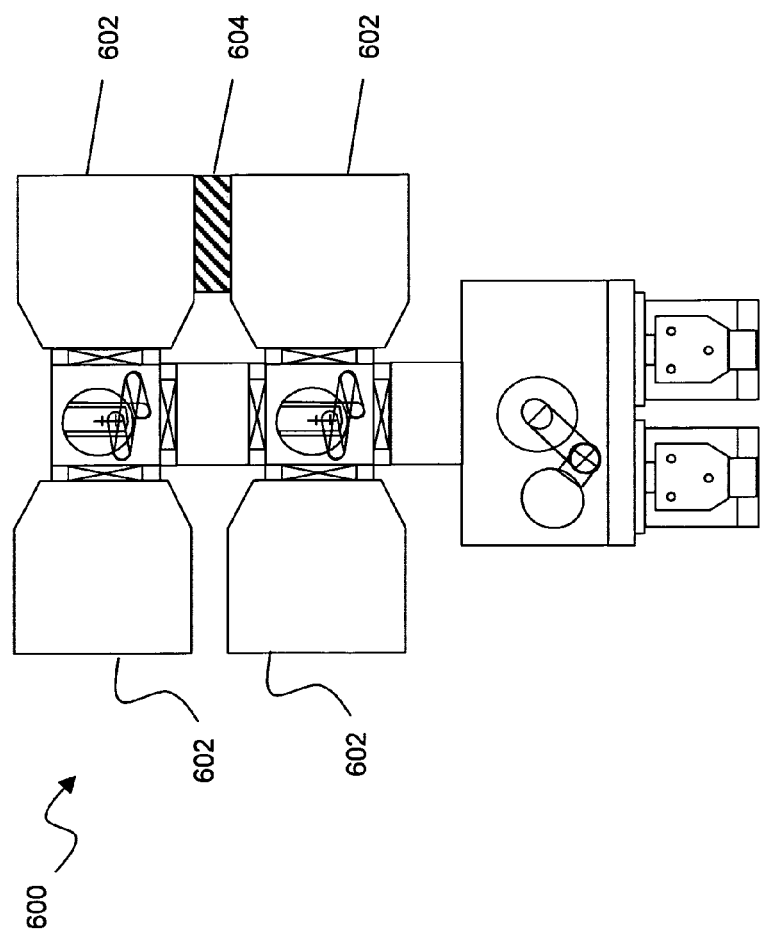
FIG. 6 shows adjacent process modules sharing a controller.

FIG. 6 shows a controller shared by a number of process modules. In a conventional system, each process module has a controller adapted specifically for control of hardware within the process module. The system 600 of FIG. 6 includes a plurality of process modules 602 which may be any of the process modules described above, and may perform identical, similar, or different processes from one another. As depicted, two of the modules 602 are placed side-by-side and share a controller 604. The controller 604 may control hardware for both of the side-by-side modules 602, and provide an interface for external access/control. The interface may be part of a software system and permits the user to run a simulation of the system. The interface may allow the user to view the linking and configuration of various links, robotic arms and other components, to optimize a configuration of the hardware (such as by moving the flow of materials through various components, moving process modules, moving robots, or the like). In embodiments the interface may be a web interface. In addition, sensors may be associated with the modules 602 to provide data to the controller 604, as well as to recognize when a module is attached to an integrated processing system. Using a shared controller 604, which may be a generic controller suitable for use with many different types of modules 602 or a module-specific controller, advantageously conserves space around process modules 602 permitting denser configurations of various tools, and may reduce costs associated with providing a separate controller for each process module 602. The modules 602 may also, or instead, share facilities such as a gas supply, exhaust(s), water, air, electricity, and the like. In an embodiment, the shared controller 604 may control shared facilities coupled to the modules 602.

Figure 7:
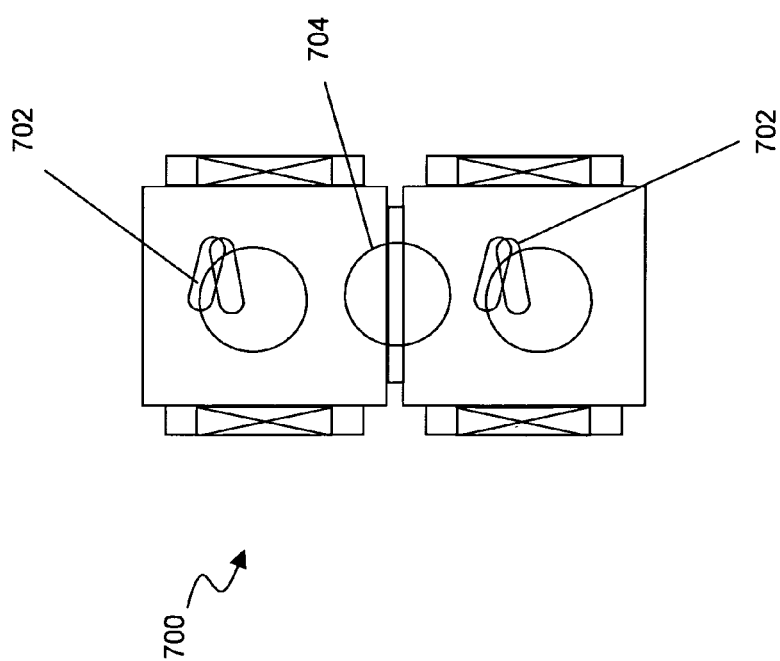
FIG. 7 shows two robotic arms sharing a buffer.

FIG. 7 shows two robotic arms sharing a buffer. In this system 700, two robots 702 transfer wafers via a buffer 704. It will be noted that no isolation valves are employed between the robots 702 and/or the buffer 704. This arrangement may advantageously reduce or eliminate the need for direct robot-to-robot hand offs (due to the buffer 704), and permit closer spacing of robots 702 because no spacing is required for isolation valves. The buffer 704 may include multiple shelves or other hardware for temporary storage of wafers. In one embodiment, the buffer 704 has a number of vertically stacked shelves, and remains stationary while robotic arms 702 move vertically to pick and place on different shelves. In another embodiment, the buffer 704 has a number of vertically stacked shelves, and the buffer 704 moves vertically to bring a specific shelf to the height of one of the robots 702. In this embodiment, each robot may have an end effector or the like with a different elevation so that both robots 702 can access the buffer 704 simultaneously without collision. In other embodiments, the end effectors of different robots 702 may have complementary shapes to accommodate simultaneous linear access, or may have offset linear positions so that fingers of each end effector do not collide when both robots 702 are accessing the buffer 704. More generally, it will be appreciated that numerous physical arrangements may be devised for a robotic system 700 that includes two or more robots 702 sharing a buffer 704 within a single isolation chamber. In other embodiments, two or more buffers 704 may also be employed. Each robot may also have multiple end effectors stacked vertically, which allows the robot to transfer multiple wafers simultaneously.

Figure 8:
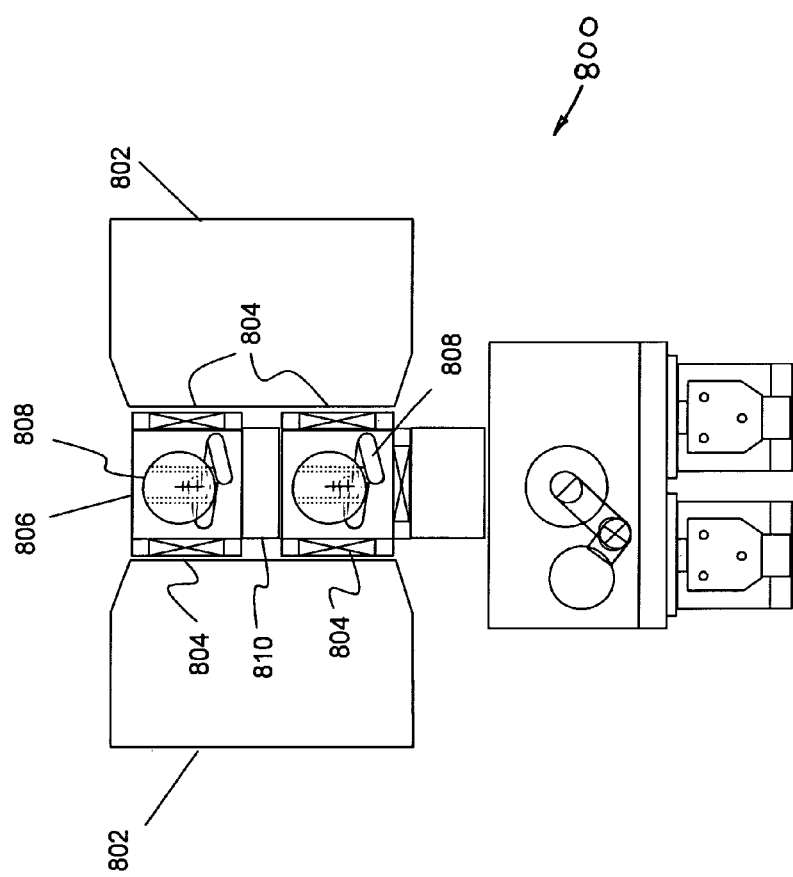
FIG. 8 shows dual entry process modules.

FIG. 8 shows a layout for dual-entry process modules. In the system 800 of FIG. 8, double-wide process modules 802 include two different entries 804, each having an isolation valve for selectively coupling an interior of the process module 802 to an external environment. As depicted, the external environment of FIG. 8 includes a single volume 806 (i.e., a shared or common environment without isolation valves) that contains two robots 808 and a buffer 810. In this embodiment, the robots 808 may hand off to one another using shelves or the like within the buffer 810, as generally described above. It will be understood that the robots 808 may also, or instead, directly hand off to one another. Each process module 802 may concurrently hold and process a number of wafers, such as two wafers, three wafers, four wafers, and so forth. It will be readily understood that two wafers may be directly accessed by the two robots 808 and entries 804, permitting parallel handling of wafers through the side-by-side entries 804. Thus, for example, two wafers (or more wafers using, e.g., batch end effectors or the like), may be simultaneously transferred from the process module 802 depicted on the left of FIG. 8 and the process module 802 depicted on the right of FIG. 8. In addition, the dual processing chamber may advantageously employ shared facilities, such as gasses, vacuum, water, electrical, and the like, which may reduce cost and overall footprint. This arrangement may be particularly useful for a module 802 having long process times (for example, in the range of several minutes) by permitting concurrent processing and/or handling of multiple wafers.

Figure 9:
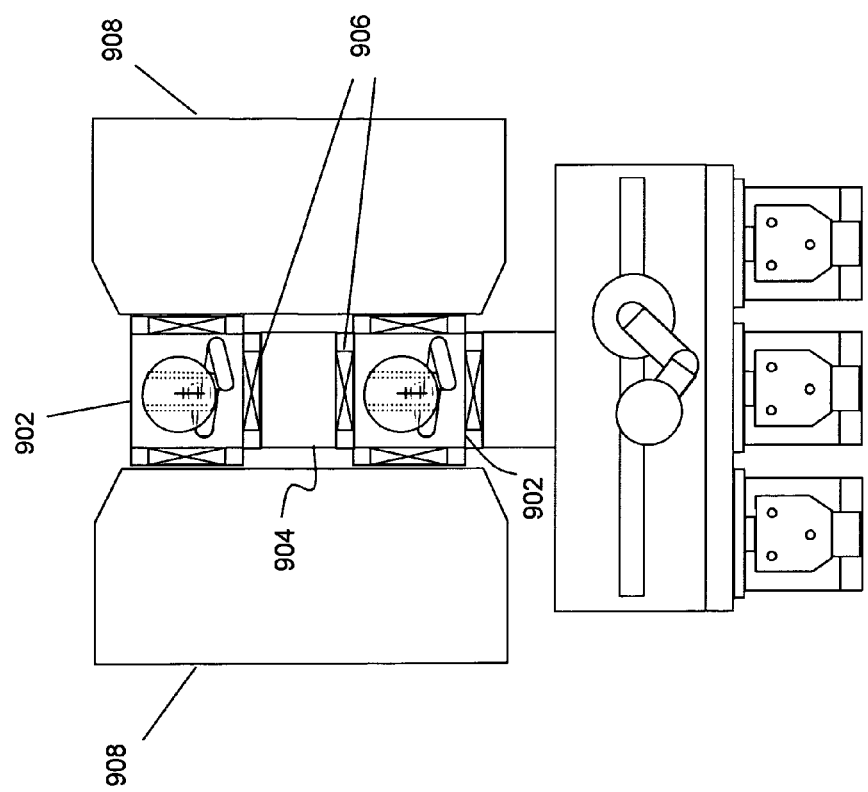
FIG. 9 shows dual entry process modules.

FIG. 9 shows a layout for a dual-entry process module. In the embodiment of FIG. 9, the robotic handlers are in chambers 902 isolated from one another by a buffer 904 with isolation valves 906. This configuration of robotics provides significant advantages. For example, the buffer 904 may be isolated to accommodate interim processing steps such as metrology or alignment, and may physically accommodate more wafers. In addition, this arrangement permits one of the robotic handlers to access a load lock/EFEM in isolation from the other robotic handler and process modules. However, this configuration requires greater separation between the robotic handlers, and requires a correspondingly wider process module 908. As noted above, various internal transport mechanisms may be provided within the process module 908 to permit movement of wafers within the module to a position close to the entry or entries. However, in some embodiments, the process module 908 may only process two wafers simultaneously.

It will be understood that the embodiments of FIGS. 8-9 may be readily adapted to accommodate three, four, or more entries with suitable modifications to entries, modules, and robotics. All such variations are intended to fall within the scope of this disclosure. As with other process modules described herein, these modules may also be readily adapted to batch processing by providing, for example, vertically stacked shelves and robots with dual or other multiple end effectors.

Figure 10:
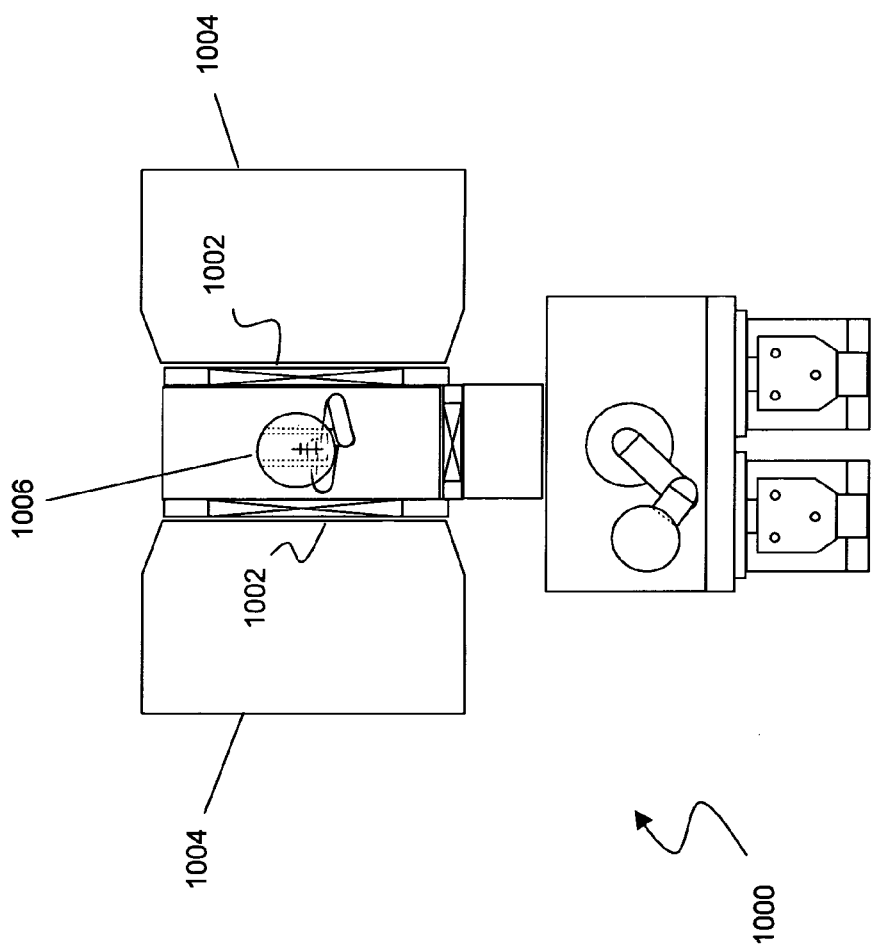
FIG. 10 shows a process module with an oversized entry.

FIG. 10 shows a process module with an over-sized entry. In the embodiment of FIG. 10, an entry 1002 to a process module 1004 may be substantially wider than the diameter of wafers handled by the system 1000. In general, the increased width of the entry 1002 and a corresponding isolation valve permits linear access by a robot 1006 to more of the space within an interior chamber of the process module 1004. In embodiments, the entry 1002 may have a width that is 50% greater than the diameter of a wafer, twice the diameter of a wafer, or more than twice the diameter of a wafer. In embodiments, the entry 1002 has a width determined by clearance for linear robotic access (with a wafer) to predetermined positions within the process module 1004, such as the corners of the module 1004 opposing the entry 1002, or other positions within the module 1004. While it is possible for robots to reach around corners and the like, linear access or substantially linear access simplifies robotic handling and requires less total length of links within a robotic arm. In one aspect, two such process modules 1004 may share a robotic handler, thereby permitting a high degree of flexibility in placement and retrieval motions for wafers among the modules 1004.

Figure 11:
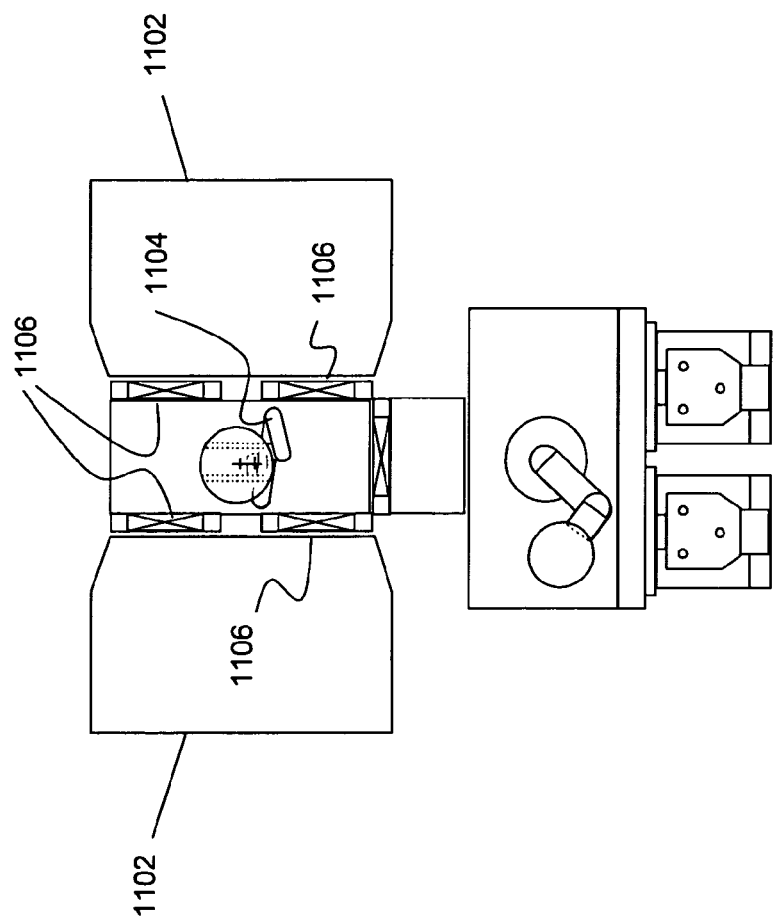
FIG. 11 shows side-by-side process modules.

FIG. 11 shows a dual entry process module. Each process module 1102 may be a dual-entry process module having two entries as described, for example with reference to FIG. 9 above. In the embodiment of FIG. 11, a single robot 1104 may service each entry 1106 of one or more of the process modules 1102. Due to the long reach requirements, the robot 1104 may include a four-link SCARA arm, a combination of telescoping and SCARA components, or any other combination of robotic links suitable for reaching into each entry 1106 to place and retrieve wafers in the process module(s) 1102.

Figure 12:
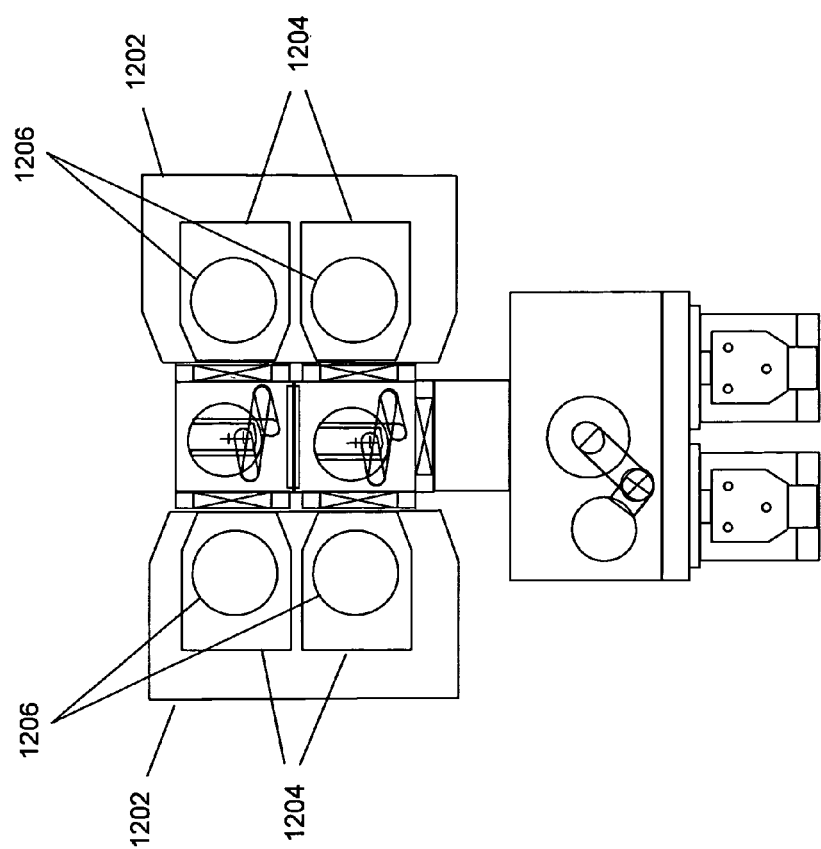
FIG. 12 shows multi-process modules.
Figure 13:
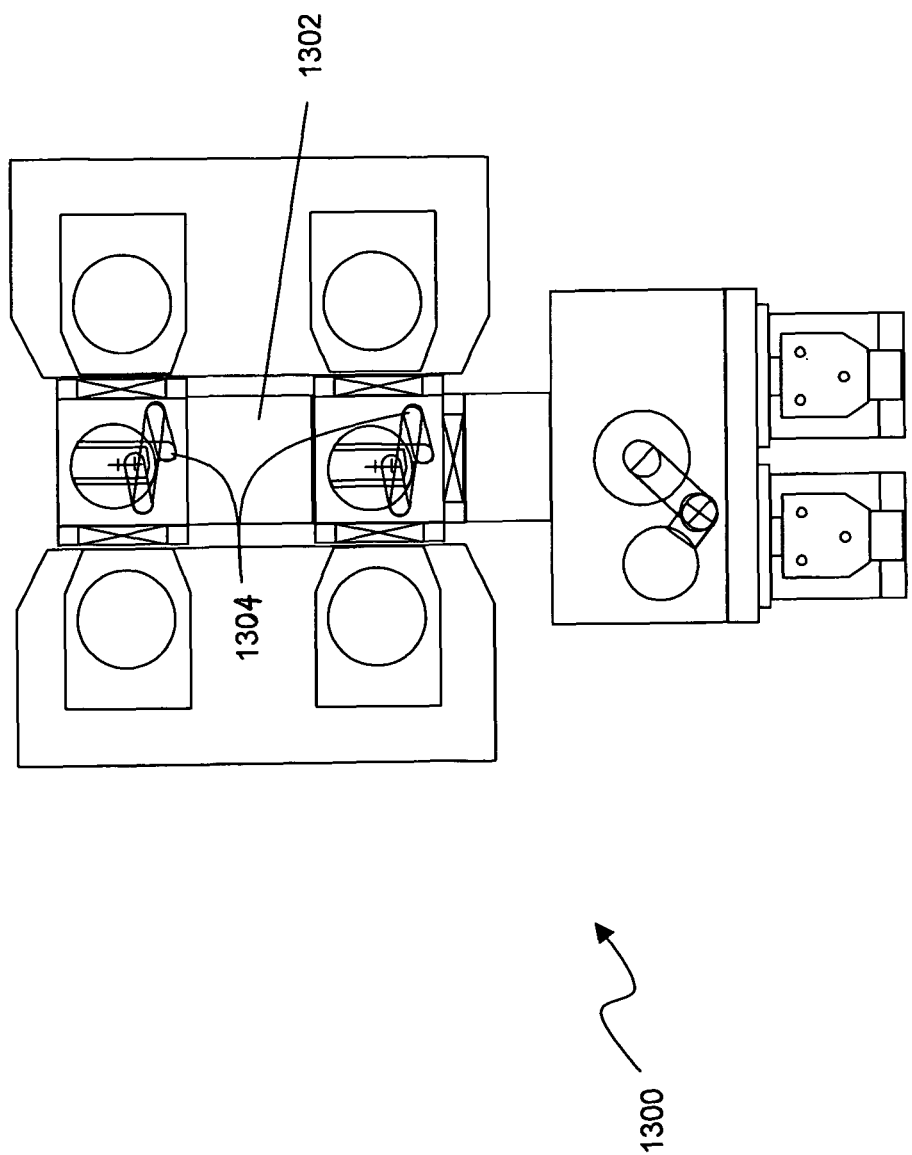
FIG. 13 shows multi-process modules.

FIG. 12 shows multi-process modules. In the embodiment of FIG. 12, a process module 1202 may include two (or more) vacuum sub-chambers 1204 for independently processing wafers 1206. Each vacuum sub-chamber 1204 may be separated from the other by a wall or similar divider that forms two isolated interiors within the module 1202. Each vacuum sub-chamber 1204 may, for example include one or more independent processing tools and an independent vacuum environment in the corresponding interior chamber selectively isolated with an isolation valve. In other embodiments, each sub-chamber 1204 may include a shared tool that independently processes each wafer 1206, so that a single environment is employed within the process module 1202 even through wafers are processed separately and/or independently. FIG. 13 shows a multi-process module system 1300 employing a buffer 1302 between robots 1304. The isolation entries and/or isolation valves may be substantially coplanar, such as to abut linearly arranged robotic handlers or other planar surfaces of handling systems.

Figure 14:
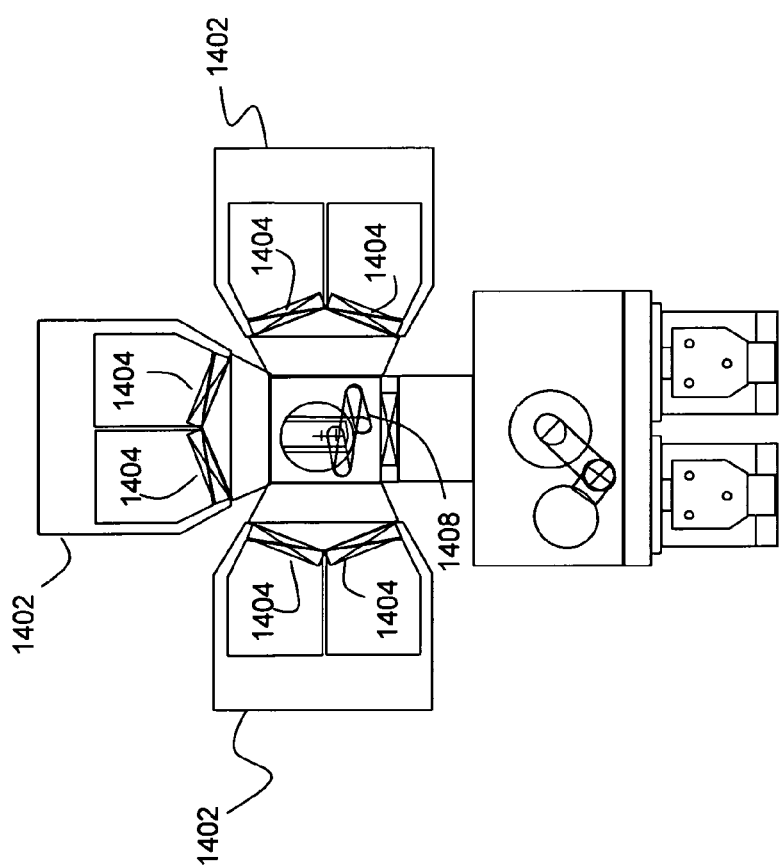
FIG. 14 shows multi-process modules.

FIG. 14 shows multi-process modules. In the embodiment of FIG. 14, each process module 1402 may include a number of entries 1404 for selective isolation of the processing environment within the process modules 1402. In this embodiment, the entries 1404 for each module 1402 form planes that are angled with respect to one another. In one embodiment, these planes are oriented substantially normal to a ray from a wafer center within the module 1402 to a center of the robotic handler 1408 or a center axis of the robotic handler 1408. This configuration provides a number of advantages. For example, in this arrangement, a single robot 1408 may have linear access to each process module 1402 sub-chamber. Further, three process modules 1402 may be arranged around a single robot 1408. As a significant advantage, this general configuration affords the versatility of a cluster tool in combination with the modularity of individual process modules. It will be understood that while FIG. 14 depicts each entry 1404 as servicing a single sub-chamber within a process module 1402, the process module 1402 may have a single, common interior where multiple wafers are exposed to a single process.

Figure 15:
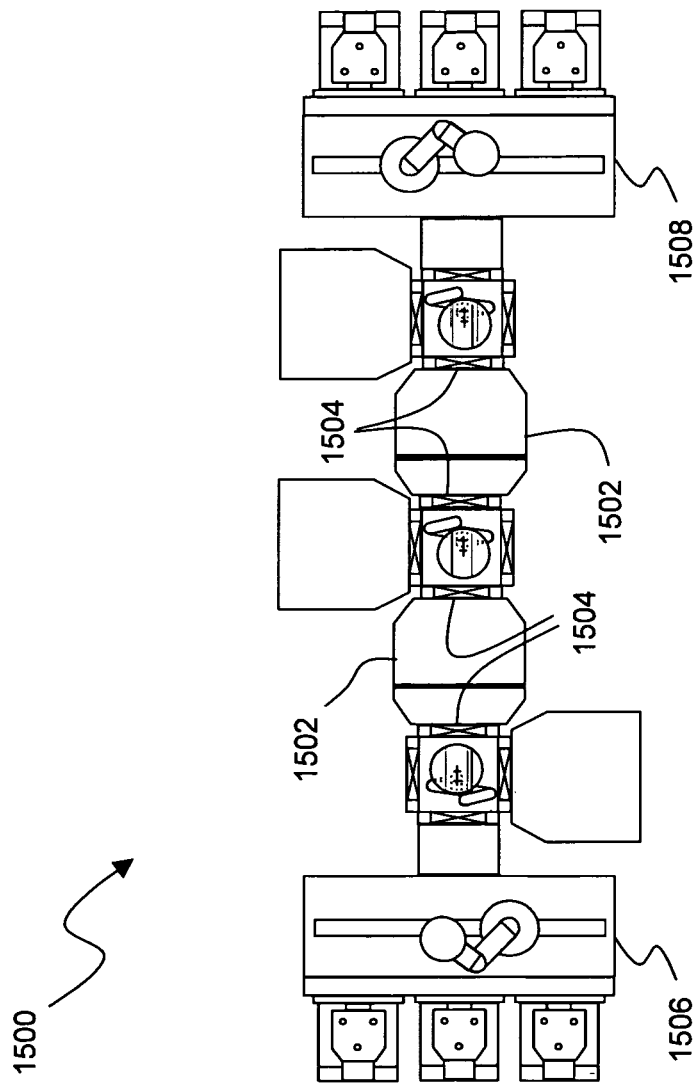
FIG. 15 shows an in-line process module in a layout.

FIG. 15 shows an in-line process module in a layout. In the system 1500, each linear process module 1502 includes two entries 1504 on substantially opposite sides of the module 1502. This configuration facilitates linear arrangements of modules by permitting a wafer to be passed into the module 1502 on one side, processed with a tool (which may be, for example, any of the tools described above, and retrieved from the module 1502 on an opposing side so that multiple linear modules 1502 and/or other modules may be linked together in a manner that effectively permits processing during transport from one EFEM 1506 (or the like) to another EFEM 1508. In one embodiment, the in-line process modules may provide processes used for all wafers in the system 1500, while the other process modules may provide optional processes used only on some of the wafers. As a significant advantage, this layout permits use of a common system for different processes having partially similar processing requirements.

In general, the embodiments depicted above may be further expanded to incorporate additional processing modules and transfer robot modules. The following figures illustrate a number of layouts using the process modules described above.

Figure 16:
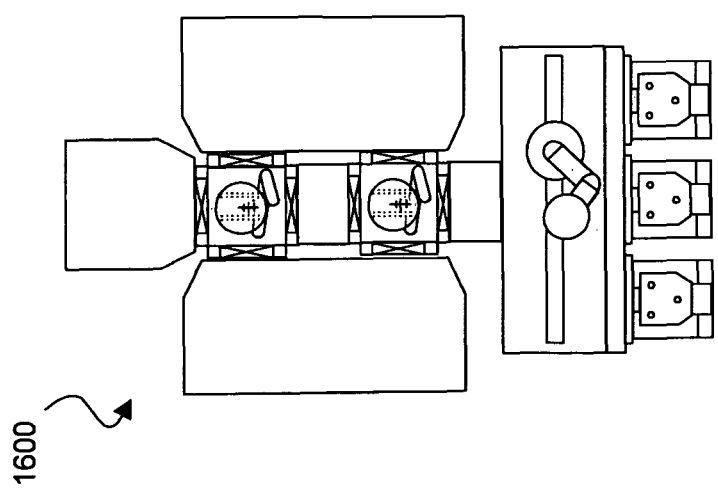
FIG. 16 shows a layout using dual entry process modules.

FIG. 16 shows a layout using dual entry process modules. In this system 1600, two dual-entry process modules share a robotic handling system with a conventional, single process module. In an example deployment, the dual-entry process modules may implement relatively long processes, while the conventional module provides a single, short process. The robotics may quickly transfer a series of wafers between the buffer and the short process module while a number of wafers are being processed in the dual entry process modules.

Figure 17:
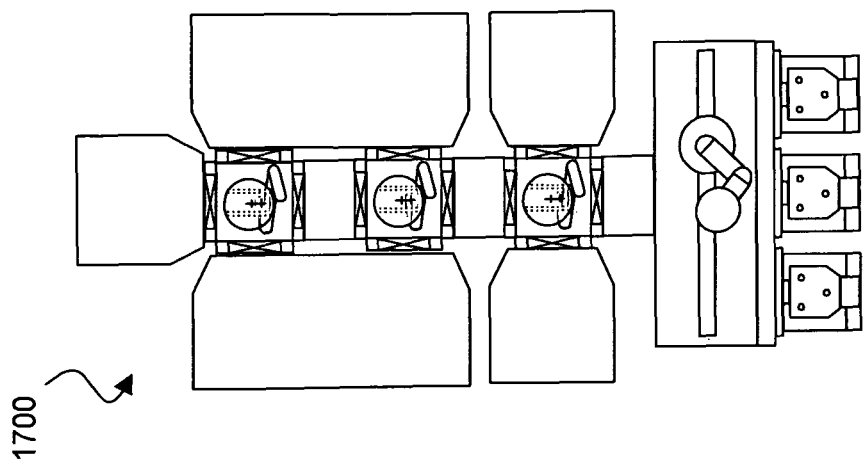
FIG. 17 shows a layout using dual entry process modules.

FIG. 17 shows a layout using dual entry process modules. In this system 1700, two additional process modules are added. This may be useful, for example, to balance the duty cycles of various process modules thereby providing higher utilization of each module, or provide for more efficient integration of relatively fast and slow processes or process modules within a single environment.

FIG. 18 shows a process module containing a scanning electron microscope. The system 1800 may include an EFEM or FOUP 1802, an entry 1804 including an isolation valve, a robotic handler 1806, and a scanning electron microscope 1808. The entry 1804 may provide selective isolation to the robotic handler 1806 and/or microscope 1808, and the robotic handler 1806 may transfer wafers between the microscope 1808 and the rest of the system 1800. This general configuration may be employed to add a scanning electron microscope to a semiconductor manufacturing system in a manner similar to any other process module, which advantageously permits microscopic inspection of wafers without removing wafers from the vacuum environment, or to add a stand-alone microscope to a vacuum environment fabrication facility FIG. 19 shows a process module containing an ion implantation system. The system 1900 may include an EFEM or FOUP 1902, an entry 1904 including an isolation valve, a robotic handler 1906, and an ion implantation system 1908. The entry 1904 may provide selective isolation to the robotic handler 1906 and/or ion implantation system 1908, and the robotic handler 1906 may transfer wafers between the ion implantation system 1908 and the rest of the system 1900. This general configuration may be employed to add an ion implantation tool to a semiconductor manufacturing system in a manner similar to any other process module, which advantageously permits ion implantation on wafers without removing wafers from the vacuum environment, or to add a stand-alone implantation system to a vacuum environment fabrication facility.

Figure 20:
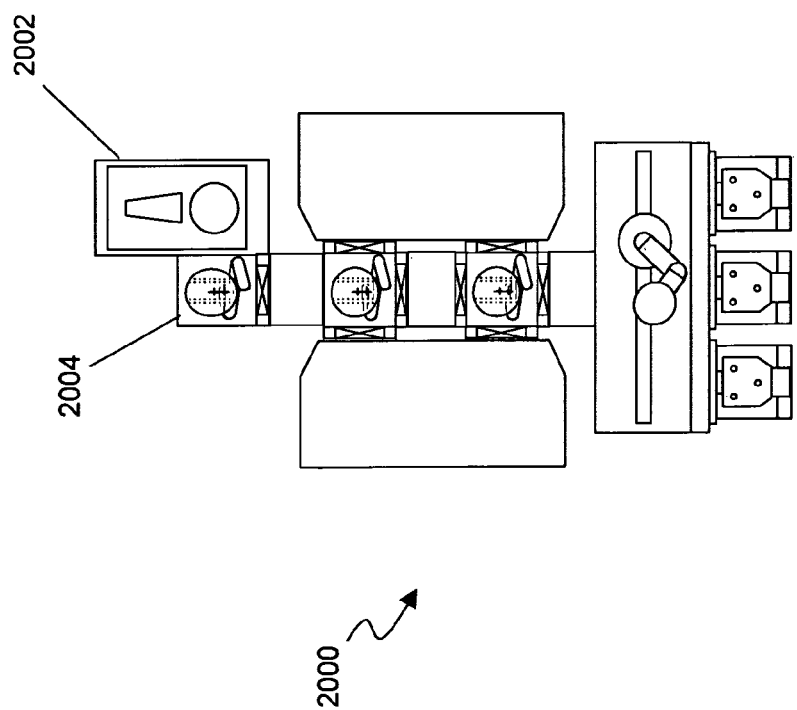
FIG. 20 shows a layout using a scanning electron microscope module.

FIG. 20 shows a layout using a scanning electron microscope module. As illustrated, the system 2000 includes a scanning electron microscope module 2002 with an integrated transfer robot 2004. This hardware is incorporated into the semiconductor processing system 2000, including additional transfer robotics, process modules, and EFEM. Such an embodiment may be useful for handling and setup of a microscopic scanning function within a vacuum processing environment, allowing the semiconductor work piece to be kept in vacuum throughout the process, including intermittent or final inspection using electron microscopy. While the illustrated system 2000 includes two dual-entry process modules as additional processing hardware, it will be understood that any suitable combination of process modules may be employed with the systems described herein.

Figure 21:
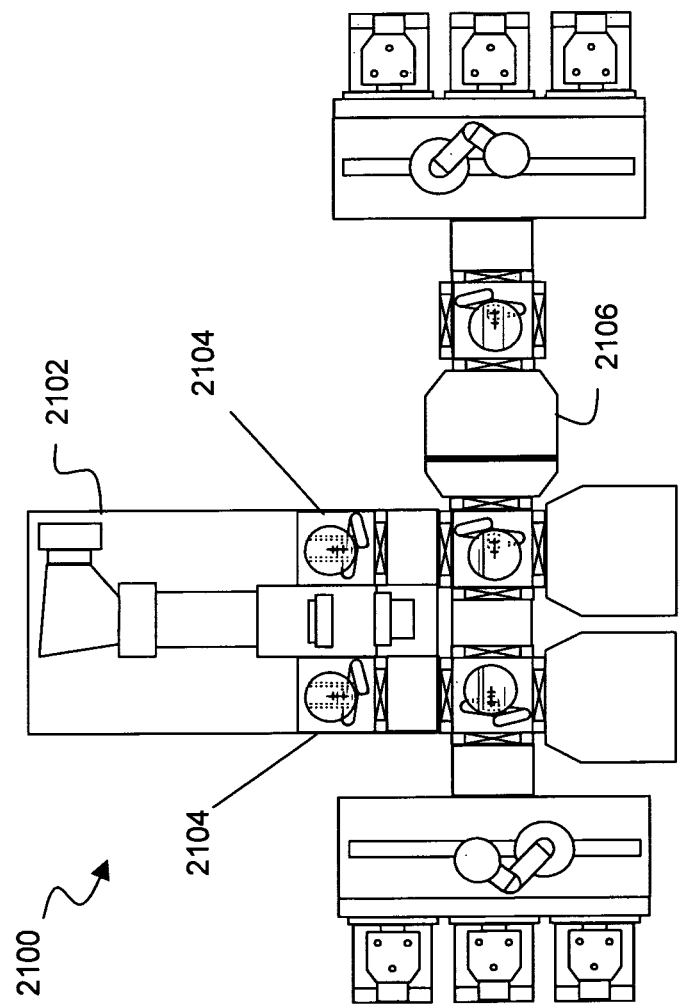
FIG. 21 shows a layout using an ion implantation module.

FIG. 21 shows a layout using an ion implantation module. As illustrated, the system 2100 includes an ion implantation system 2102 and two robotic handlers 2104. This hardware is incorporated into the semiconductor processing system 2100, which includes additional transfer robotics, process modules, and two EFEMs. Such an embodiment may be useful for handling and setup of ion implantation within a vacuum-processing environment, allowing the wafer to be kept in vacuum throughout a multi-step process that includes one or more ion implantation steps. The process system is configured such that wafers that do not require ion implantation may bypass the ion implantation system through two robots and a buffer. Such a wafer may nonetheless be processed in other process modules connected to the system 2100.

A linear process module 2106 may also be provided. This configuration may be particularly useful in high-throughput processes so that a bottleneck is avoided at either entry to or exit from the vacuum environment. In addition, the linear process module 2106 may be simultaneously or nearly simultaneously loaded from one entry while being unloaded from the other entry.

Figure 22:
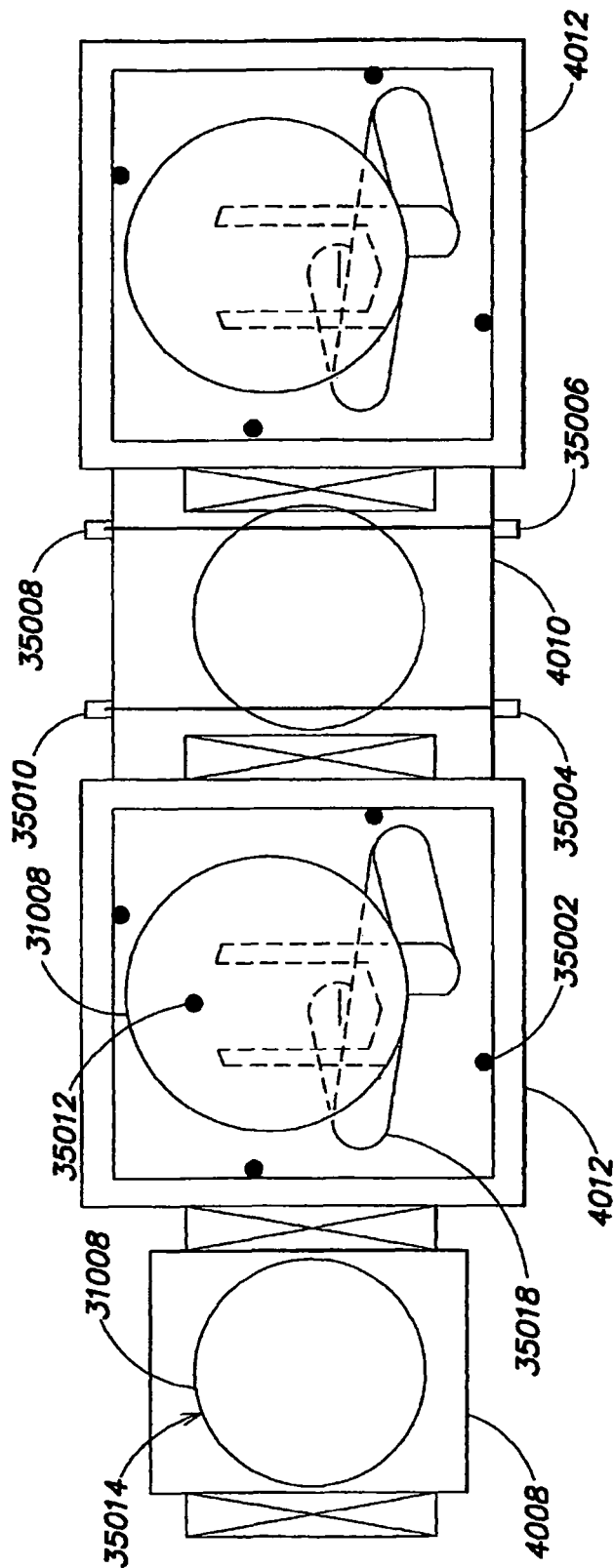
FIG. 22 illustrates a fabrication facility including the placement of optical sensors for detection of robotic arm position and materials in accordance with embodiments of the invention.

FIG. 22 illustrates a fabrication facility including a series of sensors 35002. In many fabrication facilities such sensors 35002 are commonly used to detect whether a material 35014 is still present on a robotic arm 35018. Such sensors 35002 may be commonly placed at each vacuum chamber 4012 entry and exit point. Such sensors 35002 may consist of a vertical optical beam, either employing an emitter and detector, or employing a combination emitter/detector and a reflector. In a vacuum handling facility, the training of robotic stations is commonly accomplished by a skilled operator who views the position of the robot arm and materials and adjusts the robot position to ensure that the material 35014 is deposited in the correct location. However, frequently these positions are very difficult to observe, and parallax and other optical problems present significant obstacles in properly training a robotic system. Hence a training procedure can consume many hours of equipment downtime.

Several automated training applications have been developed, but they may involve running the robotic arm into a physical obstacle such as a wall or edge. This approach has significant downsides to it: physically touching the robot to an obstacle risks damage to either the robot or the obstacle, for example many robot end effectors are constructed using ceramic materials that are brittle, but that are able to withstand very high wafer temperatures. Similarly, inside many process modules there may be objects that are very fragile and easily damaged. Furthermore, it may not be possible to employ these auto-training procedures with certain materials, such as a wafer 3 1008 present on the robot end effector. Moreover, the determination of vertical position is more difficult because upward or downward force on the arm caused by running into an obstacle is much more difficult to detect.

In the systems described herein, a series of sensors 35002-35010 may include horizontal sensors 35004-35010 and vertical sensors 35002. This combination of sensors 35002-35010 may allow detection, for example through optical beam breaking, of either a robotic end effector, arm, or a handled object. The vertical sensor 35002 may be placed slightly outside the area of the wafer 31008 when the robotic arm 3501 8 is in a retracted position. The vertical sensor 35002 may also, or instead, be placed in a location such as a point 35012 within the wafer that is centered in front of the entrance opening and covered by the wafer when the robot is fully retracted. In this position the sensor may be able to tell the robotic controller that it has successfully picked up a wafer 31008 from a peripheral module.

Horizontal sensors 35004-35010 may also be advantageously employed. In vacuum cluster tools, horizontal sensors 35004-35010 are sometimes impractical due to the large diameter of the vacuum chamber, which may make alignment of the horizontal sensors 35004-35010 more complicated. In the systems described above, the chamber size may be reduced significantly, thus may make it practical to include one or more horizontal sensors 35004-35010.

FIG. 23A-C illustrates other possible locations of the horizontal sensors 35004-35010 and vertical sensors 35002, such as straight across the chamber (36002 and 36008) and/or through mirrors-36006 placed inside the vacuum system.

FIG. 24A-B illustrates a possible advantage of placing the sensor 35002 slightly outside the wafer 37001 radius when the robot arm is fully retracted. During a retract motion the sensor 35002 detects the leading edge of the wafer 37001 at point "a" 37002 and the trailing edge at point "b" 37004. These results may indicate that the wafer 37001 was successfully retrieved, but by tying the sensor 35002 signal to the encoders, resolvers or other position elements present in the robotic drive, one can also calculate if the wafer 37001 is centered with respect to the end effector. The midpoint of the line segment "a-b" 37002, 37004 should correspond to the center of the end effector because of the circular geometry of a wafer 37001. If the wafer 37001 slips on the end effector, inconsistent length measurements may reveal the slippage.

Additionally, during a subsequent rotation and movement, a second line segment "c-d" 37008, 37010 may be detected when the wafer 37001 edges pass through the sensor. Again, the midpoint between "c" 37008 and "d" 37010 should coincide with the center of the end effector, and may permit a measurement or confirmation of wafer centering.

The above method may allow the robot to detect the wafer 37001 as well as determine if the wafer 37001 is off-set from the expected location on the end effector.

The combination of horizontal and vertical sensors 35002-35010 may allow the system to be taught very rapidly using non-contact methods: the robotic arm and end effectors may be detected optically without the need for mechanical contact. Furthermore, the optical beams can be used during real-time wafer 37001 handling to verify that wafers 37001 are in the correct position during every wafer 37001 handling move.

It will be understood that, while specific modules and layouts are have been described in detail, these examples are not intended to be limiting, and all such variations and modifications as would be apparent to one of ordinary skill in the art are intended to fall within the scope of this disclosure. For example, while FIG. 12 depicts two robots in a shared common environment handling wafers for the modules 1202, a variety of other arrangements are possible. For example, all of the entries 1204 may be serviced by a single robot as described above with reference to FIG. 11, or the entries 1204 may be serviced by a pair of robots separated by an isolated buffer as described above with reference to FIG. 9. As another example, while numerous examples are provided above of dual entry or dual process modules, these concepts may be readily adapted to three entry or three process modules, or more generally, to any number of modules consistent with a particular fabrication facility or process.

Further, it should be understood that the devices disclosed herein may be combined in various ways within a semiconductor fabrication system, for example to form fabrication facilities adapted to balance processing load among relatively fast and relatively slow processes, or between processes amenable to batch processing and processes that are dedicated to a single wafer. Thus, while a number of specific combinations of modules are shown and described above, it will be appreciated that these combinations are provided by way of illustration and not by way of limitation, and that all combinations of the process modules disclosed herein that might usefully be employed in a semiconductor fabrication system are intended to fall within the scope of this disclosure.

More generally, it will be understood that, while various features of process modules are described herein by way of specific examples, that numerous combinations and variations of these features are possible and that, even where specific combinations are not illustrated or described in detail, all such combinations that might be usefully employed in a semiconductor manufacturing environment are intended to fall within the scope of this disclosure.

What is claimed is:

1. A method comprising:
   disposing a plurality of robotic facilities to form a semiconductor handling system;
   controlling the semiconductor handling system with a controller to handoff a workpiece between neighboring robotic facilities; and
   providing a software interface for the controller, wherein the software interface permits a user to view a linking of components and view differences between alternate placement configurations of the linking of the components, robotic arms and process modules within the handling system in order to optimize a characteristic of the handling system.

2. The method of claim 1, further including adding at least one of a semiconductor processing module and a wafer handling robotic facility to the semiconductor handling system without reconfiguring existing modules.

3. The method of claim 1, further including configuring the plurality of robotic handling facilities to facilitate sequential processing of a workpiece by a first robot handing off the workpiece to a second robot between two sequential processes.

4. The method of claim 1, further including detecting a module that is connected to the vacuum handling system and causing control software associated with the connected module to be operationally linked to the system control software.

5. The method of claim 1, further including detecting an orientation of the workpiece to ensure a placement of the workpiece complies with an alignment requirement.

6. The method of claim 1, further including providing a module connected to the semiconductor handling system that includes wafer storage features that are accessible by at least one robotic handling facility.

7. The method of claim 1, further providing at least two workpiece handling robots in at least two workpiece processing planes, the robots capable of handing workpieces between the at least two planes.

8. The method of claim 1, wherein the semiconductor handling system includes at least two different wafer processing modules for performing a process, the process selected from a list consisting of chemical vapor deposition, physical vapor deposition, etching, plasma processing, lithography, plating, cleaning, and spin coating.

9. A system comprising:
   a plurality of robotic facilities configured to form a semiconductor handling system, wherein each of the plurality of robotic facilities includes at least one robot for handling a workpiece, the plurality of robot facilities configured to handoff the workpiece between neighboring robots; and
   a software interface for a controller of the handling system, wherein the software interface permits a user to view a linking of components and view differences between alternate placement configurations of the linking of the components, robotic arms and process modules within the handling system in order to optimize a characteristic of the handling system.

10. The system of claim 9, wherein at least one of a semiconductor processing module and a wafer handling robotic facility can be added to the semiconductor handling system without reconfiguring existing modules.

11. The system of claim 9, wherein the plurality of robotic handling facilities is configured to facilitate sequential processing of a workpiece by a first robot handing off the workpiece to a second robot between two sequential processes.

12. The system of claim 9, further including module control software that is operationally linked to the vacuum system software controller when a connection between a module and the vacuum system is detected.

13. The system of claim 9, wherein an orientation of the workpiece is detected and the detected orientation is used to ensure a placement of the workpiece complies with an alignment requirement.

14. The system of claim 9, further including a module connected to the semiconductor handling system that includes wafer storage features that are accessible by at least one robotic handling facility.

15. The system of claim 9, the semiconductor handling system further including at least two workpiece handling robots in at least two workpiece processing planes, the robots capable of handing workpieces between the at least two planes.

16. The system of claim 9, wherein the semiconductor handling system includes at least two different wafer processing modules for performing a process, the process selected from a list consisting of chemical vapor deposition, physical vapor deposition, etching, plasma processing, lithography, plating, cleaning, and spin coating.

17. A system comprising:
a configurable vacuum robotic wafer handling facility that includes an interior accessible through a plurality of entrances;
two sensors for each one of the plurality of entrances disposed in the interior, each sensor capable of detecting a presence of a wafer at a predetermined location within the interior, wherein the sensors are arranged so that at least two of the sensors detect the wafer for any position of the wafer entirely within the interior;
a controller for the handling facility; and
a software interface for the controller for permitting a user to view a linking of components and view differences between alternate placement configurations of the linking of the components, robotic arms and process modules within the handling facility in order to optimize a characteristic of the handling facility.

18. The system, of claim 17, wherein at least one of a semiconductor processing module and a wafer handling robotic facility can be added to the semiconductor handling system without reconfiguring existing modules.

19. The system of claim 17, wherein the plurality of robotic handling facilities is configured to facilitate sequential processing of a workpiece by a first robot handing off the workpiece to a second robot between two sequential processes.

20. The system of claim 17, further including module control software that is operationally linked to the semiconductor handling system software controller when a connection between a module and the vacuum system is detected.

* * * * *